(12) United States Patent
Balzano

(10) Patent No.: US 6,739,878 B1
(45) Date of Patent: May 25, 2004

(54) PRESSURE POINT CONTACT FOR FLEXIBLE CABLE

(76) Inventor: Alfiero Balzano, 11371 Monarch St., Garden Grove, CA (US) 92841

( * ) Notice: Subject to any disclaimer, the term of this patent is extended or adjusted under 35 U.S.C. 154(b) by 0 days.

(21) Appl. No.: 10/385,364

(22) Filed: Mar. 10, 2003

Related U.S. Application Data

(60) Provisional application No. 60/364,606, filed on Mar. 18, 2002.

(51) Int. Cl.[7] .............................................. H01R 12/00
(52) U.S. Cl. ........................................ 439/67; 439/493
(58) Field of Search ........................... 439/67, 77, 492, 439/493

(56) References Cited

U.S. PATENT DOCUMENTS

| | | | | |
|---|---|---|---|---|
| 4,116,517 A | * | 9/1978 | Selvin et al. | 439/67 |
| 4,850,883 A | * | 7/1989 | Kabadi | 439/67 |
| 5,007,842 A | * | 4/1991 | Deak et al. | 439/66 |
| 5,354,205 A | * | 10/1994 | Feigenbaum et al. | 439/67 |
| 5,961,334 A | * | 10/1999 | Inaba | 439/67 |

* cited by examiner

*Primary Examiner*—Tho D. Ta
(74) *Attorney, Agent, or Firm*—Roger A. Marrs

(57) ABSTRACT

Pressure point contact for interconnecting electronic circuits wherein one component includes a flexible cable having a plurality of conductive strips with each strip terminating in contact pads having outwardly projecting pressure point contact mounds that protrude through a layer covering the strips with electrically insulated material. The other component of the interconnecting circuit includes a plurality of conductive contact elements placed on the exposed surface of a printed circuit board, LCD or other planar surface. A pressure plate is arcuate shaped and is employed for applying pressure to the backside of the flexible cable in order to force the contact mounds into pressure engagement with the contact elements on the planar surface. To provide equal application of pressure, a flat compression stabilizer plate is placed between the arcuate pressure plate and the backside of the cable. A pressure applicator is employed for applying equal pressure via the pressure plate serving as a compression stabilizer for equalizing the application pressure to the backside of the flexible cable so that pressure is evenly distributed as pressure is applied. Alternately, the contact elements on the planar surface may include raised receptacles for registering with and insertably receiving the pressure point contact mounds.

3 Claims, 2 Drawing Sheets

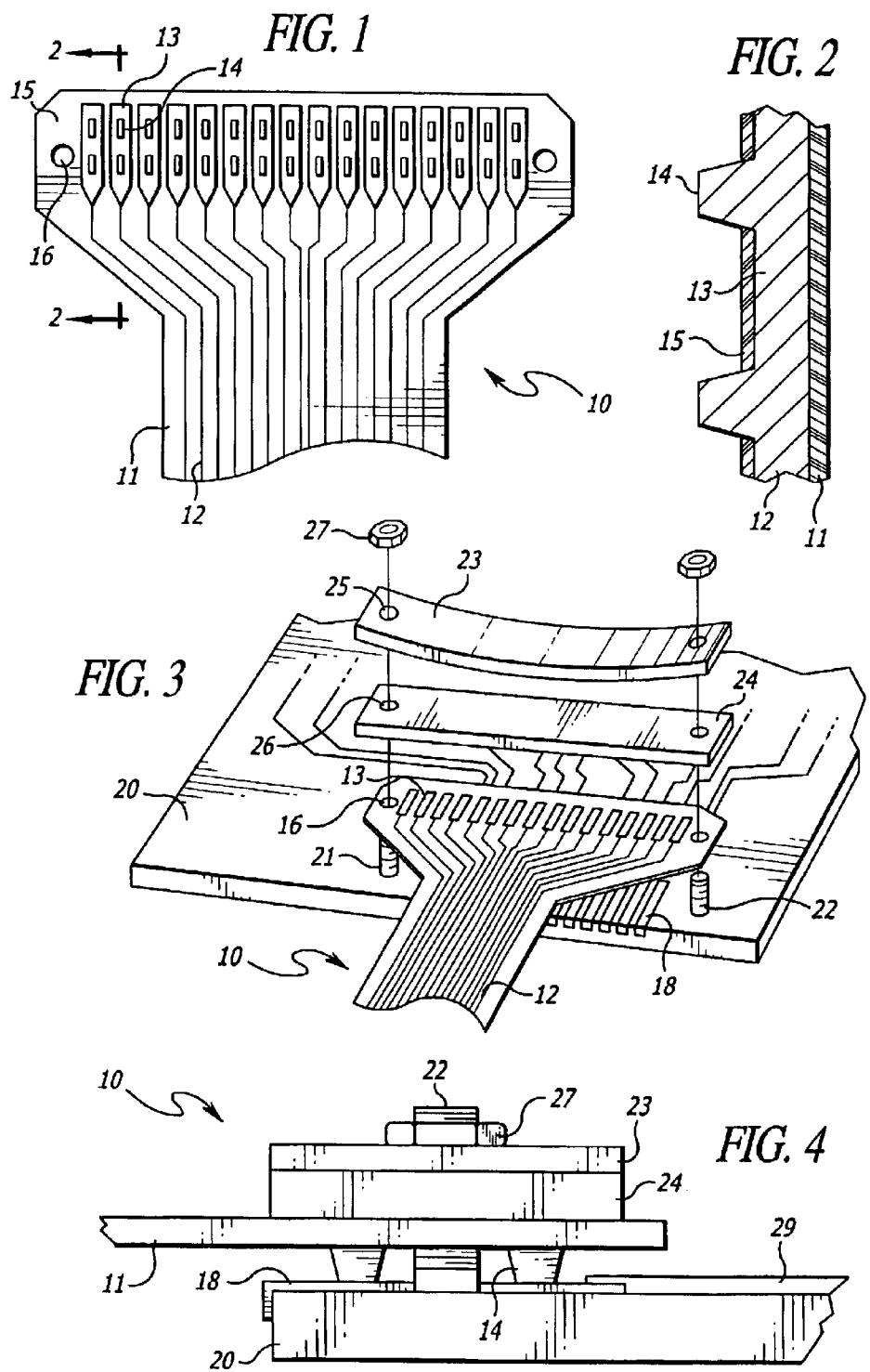

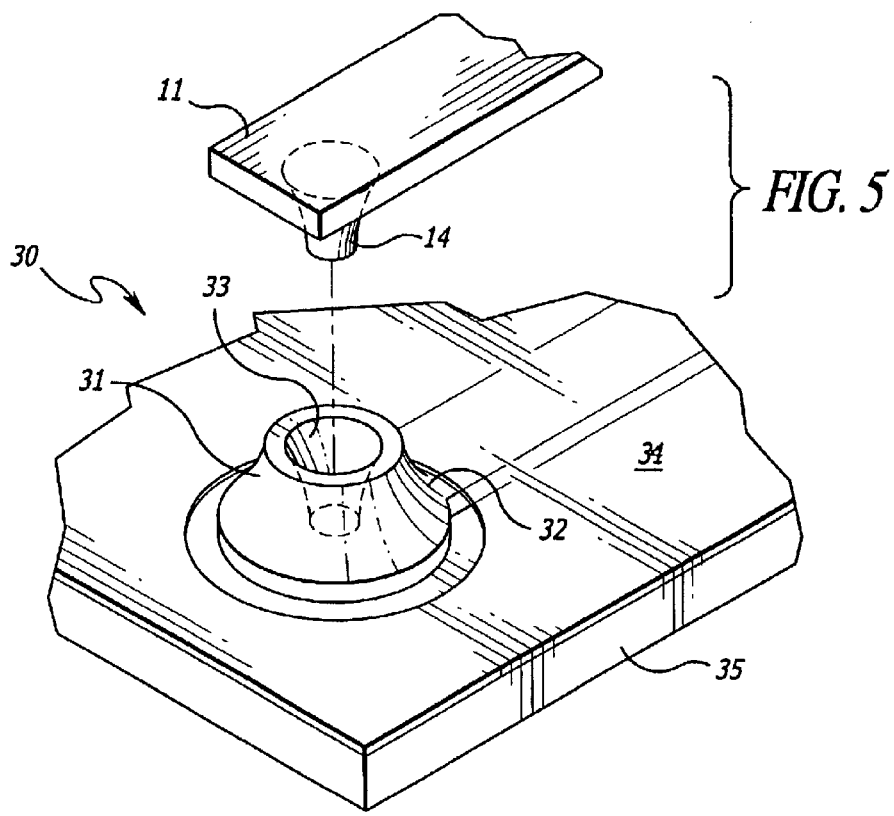
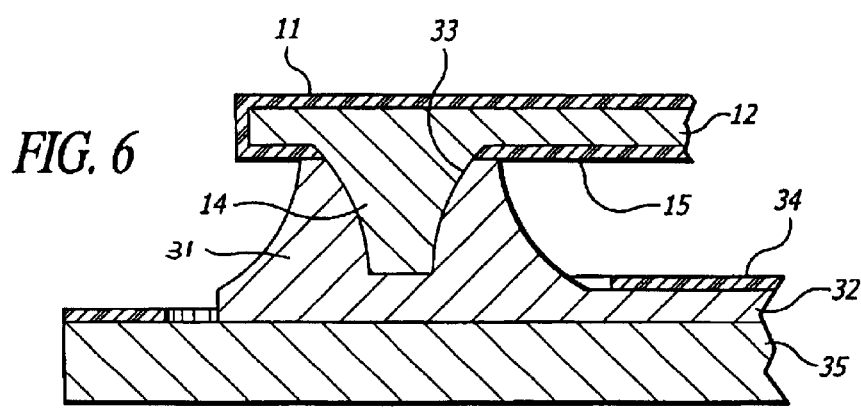

PRESSURE POINT CONTACT FOR FLEXIBLE CABLE

Priority claimed based on Ser. No. 60/364,606, filed Mar. 18, 2002.

BACKGROUND OF THE INVENTION

1. Field of the Invention

The present invention relates to the field of flexible cable interconnecting contacts and more particularly to a novel interconnecting contact arrangement for joining, under pressure, respective contacts carried on flex cable conductors with contacts on circuit elements carried on a printed circuit, LCD, or other planar surface.

2. Brief Description of the Prior Art

As the usefulness of electronic equipment, such as computers, has expanded from strictly computational and accounting types of problems to problems of simulating control and other problems, and with the widening demand, both militarily and commercially, for electronic equipment capable of handling vast quantities of information at increased rates of speed, the need for high density electronic packaging has become of increasing importance. Also, maintenance of electrical contact is also of great importance, which maintains both system reliability and serviceability. It is of an economic and reliability necessity to provide circuit interconnecting means for electronic equipment which both minimizes the possibility of error in field maintenance procedures, in unwanted contact separation, and which reduces over-all system complexity.

Attempts have been made to improve interconnecting contact construction; however, most contacts require soldering which greatly increases assembly costs and is labor intensive. Such conventional interconnecting contacts or connectors are subject to disconnection or separation due to multiple temperature changes, changes due to shock and vibration which produce loss of contact between the interconnecting elements. Problems have also been encountered because of high contact resistance and low conductivity. Furthermore, most conventional contact arrangements require complete disassembly of mated contact elements to provide for complete replacement.

Therefore, a long-standing need has existed to provide an improved means for interconnecting electronic circuits and particularly in use of flexible cable which may be readily employed for interconnecting electronic circuitry on a printed circuit board with the terminating ends of electrically conductive strips embedded in the flexible cable.

SUMMARY OF THE INVENTION

Accordingly, the above problems and difficulties are avoided by the present invention which provides an improved means for interconnecting electronic circuits wherein one component includes a flexible cable having a plurality of conductive strips which terminate in contact pads having outwardly projecting pressure point contact mounds which protrude through a covering layer of electrically insulated material. The other component of the interconnecting circuit includes a plurality of conductive contact elements placed on the exposed surface of a printed circuit board, LCD or other planar surface. A pressure plate is arcuate shaped and is employed for applying equally distributed pressure to the backside of the flexible cable in order to force the contact mounds into pressure point contact with the contact elements on the planar surface. Alternately, each contact element may include a receptacle for insertably receiving a contact mound. To provide equal application of pressure, a compression stabilizer plate is placed between the arcuate pressure plate and the backside of the cable. Pressure application means are employed for applying equal pressure via the compression stabilizer and pressure plate to the backside of the flexible cable so that pressure is evenly distributed as pressure is applied thereto.

Therefore, it is among the primary objects of the present invention to provide an improved means for interconnecting electronic circuits employing contact between contact mounds carried on a flexible cable and contact elements carried on a planar surface, with or without receptacles, employing a controlled pressure means for forcibly engaging the contact mounds and elements together.

Another object of the present invention is to provide a novel pressure point contact arrangement for a flexible cable having surface mount connections with contact pads which drastically reduces assembly costs and is labor effective.

Another object of the present invention is to provide a pressure point contact arrangement which eliminates soldering and is secured to operate as an integral part of an assembly able to withstand multiple temperature changes, shock and vibration movements, all without inadvertent loss of contact or disconnection.

Yet another object resides in providing a pressure point contact arrangement having a shaped mound carried on a conductive strip mateable with a conformally shaped receptacle carried on a conductive pad utilizing compressive means to make an initial connection resisting inadvertent separation and disconnection.

Still a further object of the invention resides in providing a pressure point contact for flexible cable and surface mounted connections which provides for easy assembly and disassembly without destruction of the contacts.

Yet a further object resides in providing an improved means for interconnecting flexible cable conductive strips with contacts on a planar surface employing controlled pressure application so as to eliminate solder and which may be interconnected to any printed circuit, LCD display or flat circuit interface.

BRIEF DESCRIPTION OF THE DRAWINGS

The features of the present invention which are believed to be novel are set forth with particularity in the appended claims. The present invention, both as to its organization and manner of operation, together with further objects and advantages thereof, may best be understood with reference to the following description, taken in connection with the accompanying drawings in which:

FIG. 1 is an elevational view of the underside of the terminating end of flexible cable illustrating the contact point mounds incorporating the present invention;

FIG. 2 is an enlarged, fragmentary view, in section, of the pressure point contact mound illustrated in FIG. 1 as taken in the direction of arrows 2—2 thereof;

FIG. 3 is an exploded perspective view illustrating the procedure for assembly and for applying the pressure point contact mounds to receiving flat contacts on a planar surface employing the pressure means;

FIG. 4 is a side-elevational view of engagement between the pressure point mounds and the flat contacts;

FIG. 5 is a perspective view of an alternative contact element having a shaped recess or receptacle for insertably receiving a shaped pressure point contact mound; and FIG. 6 is an exploded cross-sectional view of the contact mound preparatory for insertion into the recess or receptacle of the other contact element.

DESCRIPTION OF PREFERRED EMBODIMENT

Referring to FIG. 1, the novel improved means for interconnecting electronic circuits is indicated in the general direction of arrow 10 wherein one component of the pressure point contact means includes a flexible cable 11 having a plurality of conductive strips 12 arranged in fixed, parallel, spaced-apart relationship, and wherein each of the respective conductive strips terminates in a contact pad, such as pad 13, having outwardly projecting pressure point contact mounds 14 which protrude through a covering layer 15 of electrically insulated material. A pair of attachment holes such as hole 16 are provided in side lobes of the flexible cable terminating end.

Although the conductive pads and mounds are constructed at the terminating ends of each of the respective conductive strips, it is to be understood that such pads can be placed anywhere along the length of the conductive strip with the mounds 14 extending through layer 15 so as to be exposed for external contact.

Referring now to FIG. 2, it can be seen that each of the respective mounds 14 project through the insulative layer 15 so as to be fully exposed. At least one mound is provided for each pad 13. Preferably, the insulative layer 15 is composed of a suitable plastic or plastic-like material and as illustrated is transparent or translucent so as to expose the runs of conductive material 12 for visual observation and view.

In FIG. 3, the other contact component of the interconnecting circuit includes standard conductive contact elements, such as element 18, placed on the exposed surface of a printed circuit board 20, LCD or other planer surface. Appropriate conductive strips covered by insulative material 29 representing a circuit are connected to the respective contact elements 18, and it is intended that the mounds 14, projecting through layer 15 on the undersurface or layer of the flex cable, mate with and be in alignment or registry with the plurality of contact elements 18. Once such alignment has been made, attachment means such as threaded posts or screws 21 and 22 are inserted through the attachment holes 16. Registry of hole 16 with the post or screws 21 and 22 provide a guide or alignment means for insuring that the mounds 14 will mate with the respective contact elements 18.

A pressure plate 23 is arcuate or bowed in front elevational view and is employed for applying pressure to the backside of the flexible cable 10 in order to force the contact mounds 14 into a pressure point contact with the contact element 18 on the planar surface. To provide equal application of pressure during compression, a compression stabilizer plate 24 is placed between the curved or arcuate pressure plate 24 and the backside of the cable 10. To insure that the pressure is properly placed along the line of pads 13 and mound 14, the opposite ends of the respective pressure plate 23 and compression stabilizer plate 24 are provided with holes in alignment with hole 16 so as to be placed over the post or screws 21 and 22 to form an assembly. Holes in the pressure plate 23 are indicated by numeral 25 while holes in the end of compression stabilizer plate 24 is indicated by numeral 26. Nuts 27 are threadably secured to the threaded posts or screws 21 and 22 and are turned evenly on opposite sides of the assembly so as to apply pressure from the center of the arcuate pressure plate 23 directly into the center of the compression stabilizer plate 24 and additional pressure is applied outwardly from the center as the pressure plate 23 is further forced into contact with the plate 24. Therefore, it can be seen that the mounds 14 carried on the pads 13 are forcibly engaged with the contact element 18. Pressure is applied evenly and sequentially along the length of the pad on the end of the flex cable 10.

Referring now in detail to FIG. 4, full compression has been achieved by the turning of nuts 27 on the threaded post or screws 21 and 22. The exposed ends of mounds 14 are pressed against the contact elements 18 and improved mechanical and electric connection ensues. The conductive strips 12 are thus electrically and mechanically connected to the circuits carried on the circuit board 20 that terminates with the contact elements 18. A feature resides in that disconnection is easily achieved by removing the nuts 27 from the respective screw or post which breaks connection between the mounds 14 and the contact elements 18. Connection can be re-made by again applying pressure via the clamping or compression action of the pressure plate 23 via tightening of the nuts 27.

Referring now in detail to FIG. 5, an alternative version of the invention is shown in the direction of arrow 30. The contact element 31 on pad 32 is not flat as previously described. The contact element is raised and includes a shaped receptacle or recess 33 for insertably receiving the mound 14 carried on the flexible cable.

FIG. 6 illustrates the position of the mound 14 preparatory to registration with and insertion into the receptacle 33. Note that the mound is frustro-conical in configuration and that the recess shape of the receptacle is conical so as to be conformal therewith. Conformance in shape aids in alignment and insertion during assembly and form fitness insures a tight fit without gaps or spaces which might otherwise permit looseness and unwanted disconnection or separation.

The connector interface of FIGS. 5 and 6 show a locking connecting interface and the component includes an overlayer 34 of insulation and an underlayer 35 of insulation.

In view of the foregoing, it can be seen that the two component pressure connection is convenient to assemble and once assembled, will not separate or disconnect until the positive applied pressure is released. The respective mounds 14 and contact elements 18 or receptacles 32 are integrally connected together and, in some instances, deformation may occur between the mounds and the receptacles to further lock and establish excellent connection and conductivity.

The same positive pressure means, such as flat plate 24, bowed plate 23, and pressure applicators 21, 22 and nuts 27, are used with the embodiment shown in FIGS. 5 and 6.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. A pressure point contact arrangement for interconnecting conductive strips carried on a flexible cable with conductive strips carried on a rigid support comprising:

a solid mound carried on each of said conductive strips of said flexible cable;

a pad carried on each of said conductive strips of said support;

alignment means cooperatively disposed between said flexible cable and said support for positioning and locating said mound with said pad;

compressive means coupling said flexible cable with said rigid support for applying pressure to said mound and said pad for providing an electrical and a mechanical integral connection between said mound and said pad;

means cooperating with said flexible cable and said rigid support for guiding said mound into engagement with said pad preparatory to application of pressure;

said flexible cable includes an insulative clad over said plurality of conductive strips;

said clad having apertures exposing said mounds for engagement with said pads;

said compression means includes a pair of plates wherein one plate is a flat plate bearing against said flexible cable and another plate which is an arcuate plate having a bowed midsection bearing against said flat plate;

pressure means carried on said rigid support with adjustable pressure applicators bearing against said arcuate plate for urging said bowed midsection to initially engage against said flat plate and subsequently causing opposite ends of said arcuate plate to press against said flat plate; and receptacles integrally provided on said pads and each receptacle having a recess for insertably receiving said mounds in an integral interference fit in response to said compression means.

2. The contact arrangement defined in claim 1 wherein:

said arcuate plate bends about said bowed midsection in response to applied pressure on its opposite ends by said pressure means.

3. The contact arrangement defined in claim 2 wherein:

said mound has a shape and said recess has an identical shape to said mound for conformal mating and engagement between opposing surfaces of said mound and said recess.

* * * * *